United States Patent
Lee et al.

(10) Patent No.: US 7,772,067 B2
(45) Date of Patent: Aug. 10, 2010

(54) METHODS OF FORMING PHASE-CHANGEABLE MEMORY DEVICES USING GROWTH-ENHANCING AND GROWTH-INHIBITING LAYERS FOR PHASE-CHANGEABLE MATERIALS

(75) Inventors: Jinil Lee, Gyeonggi-do (KR); Suk Ho Joo, Seoul (KR); Dohyung Kim, Gyeonggi-do (KR); Hyunjun Sim, Gyeonggi-do (KR); Hyeyoung Park, Gyeonggi-do (KR); Sunglae Cho, Gyeonggi-do (KR); Dong-Hyun Im, Seoul (KR)

(73) Assignee: Samsung Electronics Co., Ltd. (KR)

( * ) Notice: Subject to any disclaimer, the term of this patent is extended or adjusted under 35 U.S.C. 154(b) by 143 days.

(21) Appl. No.: 12/039,370

(22) Filed: Feb. 28, 2008

(65) Prior Publication Data

US 2009/0130797 A1    May 21, 2009

(30) Foreign Application Priority Data

Nov. 19, 2007    (KR) ...................... 10-2007-0117924

(51) Int. Cl.
*H01L 21/336* (2006.01)
(52) U.S. Cl. .................... 438/258; 438/257; 438/593; 438/E45.002
(58) Field of Classification Search ......... 438/257–258, 438/593
See application file for complete search history.

(56) References Cited

U.S. PATENT DOCUMENTS

| | | | |
|---|---|---|---|
| 6,545,287 B2 | 4/2003 | Chiang | |
| 7,115,504 B2 | 10/2006 | Moore et al. | |
| 7,214,958 B2 | 5/2007 | Happ | |
| 7,417,245 B2 * | 8/2008 | Happ et al. | 257/2 |
| 2003/0151041 A1 * | 8/2003 | Chiang | 257/3 |
| 2008/0054244 A1 * | 3/2008 | Lee et al. | 257/3 |

FOREIGN PATENT DOCUMENTS

| KR | 1020050071760 A | 7/2005 |
|---|---|---|
| KR | 1020070042910 A | 4/2007 |

\* cited by examiner

*Primary Examiner*—Dung A. Le
(74) *Attorney, Agent, or Firm*—Myers Bigel Sibley & Sajovec

(57) ABSTRACT

Methods of forming phase-changeable memory devices include techniques to inhibit void formation in phase-changeable materials in order to increase device reliability. These techniques to inhibit void formation use an electrically insulating growth-inhibiting layer to guide the formation of a phase-changeable material region within a memory cell (e.g., PRAM cell). In particular, methods of forming an integrated circuit memory device include forming an interlayer insulating layer having an opening therein, on a substrate, and then lining sidewalls of the opening with a seed layer (i.e., growth-enhancing layer) that supports growth of a phase-changeable material thereon. An electrically insulating growth-inhibiting layer is then selectively formed on a portion of the interlayer insulating layer surrounding the opening. The formation of the growth-inhibiting layer is followed by a step to selectively grow a phase-changeable material region in the opening, but not on the growth-inhibiting layer.

20 Claims, 7 Drawing Sheets

METHODS OF FORMING PHASE-CHANGEABLE MEMORY DEVICES USING GROWTH-ENHANCING AND GROWTH-INHIBITING LAYERS FOR PHASE-CHANGEABLE MATERIALS

REFERENCE TO PRIORITY APPLICATION

This application claims priority to Korean Patent Application No. 10-2007-0117924, filed Nov. 19, 2007, the disclosure of which is hereby incorporated herein by reference.

FIELD OF THE INVENTION

The present invention relates to methods of forming integrated circuit memory devices and, more particularly, to methods of forming nonvolatile memory devices.

BACKGROUND OF THE INVENTION

One class of nonvolatile memory devices includes phase-changeable random access memory (PRAM) devices, which offer many advantageous electrical characteristics relative to FLASH, SRAM and DRAM memory devices. PRAM devices support non-volatile data storage, random access addressing and relatively high speed read and write operations. PRAM devices may also be configured to have relatively low power consumption requirements.

The nonvolatile characteristics of the PRAM devices may be provided by configuring each memory cell with a chalcogenide alloy (e.g., GST: $Ge_2Sb_2Te_5$) having programmable resistivity characteristics. For example, during a write/programming operation, the chalcogenide alloy within a memory cell may undergo resistive heating to thereby alter the resistivity of the chalcogenide alloy and cause the memory cell to be "set" into one logic state or "reset" into another logic state.

FIG. 1 illustrates a conventional diode-type PRAM cell 10, which is electrically coupled to respective bit and word lines (BL and WL). In this PRAM cell 10, the chalcogenide alloy (e.g., GST alloy) may be programmed to have a relatively high resistance state (high-R state) or a relatively low resistance state (low-R state). This state may be detected during a reading operation by biasing the bit line BL at a higher voltage relative to the word line to thereby establish a forward current path through the PRAM cell 10. The magnitude of the established current (e.g., bit line current) in the forward current path is measured to determine the state (high-R or low-R) of the cell 10.

SUMMARY OF THE INVENTION

Methods of forming integrated circuit memory devices according to embodiments of the present invention include techniques to inhibit void formation in phase-changeable materials in order to increase device reliability. These techniques to inhibit void formation use an electrically insulating growth-inhibiting layer to guide the formation of a phase-changeable material region within a memory cell (e.g., PRAM cell). In particular, methods of forming an integrated circuit memory device include forming an interlayer insulating layer having an opening therein, on a substrate, and then lining sidewalls of the opening with a seed layer that operates as a growth-enhancing layer by supporting selective growth of a phase-changeable material thereon. An electrically insulating growth-inhibiting layer is then selectively formed on a portion of the interlayer insulating layer surrounding the opening. The formation of the growth-inhibiting layer is followed by a step to selectively grow a phase-changeable material region in the opening, but not on the growth-inhibiting layer. The growth-inhibiting layer may be a silicon oxide layer, a silicon nitride layer, a silicon oxynitride layer, a magnesium oxide layer and/or an aluminum oxide layer.

According to some of these embodiments, the seed layer may include a transition metal oxide, such as titanium oxide, zirconium oxide, hafnium oxide and/or tantalum oxide. In addition, the step of forming a phase-changeable material region may include selectively growing the phase-changeable material region on the seed layer within the opening. The phase-changeable material region may be a chalcogenide material region.

According to further embodiments of the invention, selectively depositing an electrically insulating growth-inhibiting layer includes sputter depositing the electrically insulating layer onto the interlayer insulating layer at a tilt angle in a range between 20° and 65° relative to a normal to the substrate. Furthermore, the step of lining sidewalls of the opening with a seed layer may include lining the sidewalls and an upper surface of the interlayer insulating layer with a seed layer having a thickness in a range between 10 Å and 30 Å. This step may be followed by selectively depositing an electrically insulating growth-inhibiting layer by sputter depositing the growth-inhibiting layer onto the seed layer at the tilt angle.

According to still further embodiments of the present invention, a method of forming an integrated circuit memory device includes forming an interlayer insulating layer having an array of openings therein, on a substrate, and then lining sidewalls of the openings and an upper surface of the interlayer insulating layer with a metal oxide seed layer using a blanket deposition technique. An electrically insulating growth-inhibiting layer is then sputter-deposited onto the metal oxide seed layer at a tilt angle in a range between 20° and 65° relative to a normal to the substrate. This deposition at a substantial tilt angle inhibits deposition into the openings within the interlayer insulating layer. The openings are then filled with respective phase-changeable material regions by growing the phase-changeable material regions from portions of the metal oxide seed layer that are not covered by the growth-inhibiting layer. Each of these regions may be capped within a corresponding upper electrode and multiple upper electrodes may be electrically connected together by a bit line.

According to additional embodiments of the invention, the step of forming the interlayer insulating layer includes forming an interlayer insulating layer having an array of openings therein that respectively include a lower electrode at a bottom of each opening. In these embodiments, the step of lining the openings includes covering the lower electrodes at the bottoms of the openings with the metal oxide seed layer.

According to still further embodiments of the invention, a method of forming an integrated circuit memory device includes forming an electrically conductive word line in a semiconductor substrate and then forming a first interlayer insulating layer having a first opening therein that extends opposite the word line, on the semiconductor substrate. The first opening is filled with a P-N junction diode having a diode electrode thereon. A second interlayer insulating layer having a second opening therein, which exposes the diode electrode, is formed on the first interlayer insulating layer. A transition metal oxide seed layer, which may have a thickness in a range between 10 Å and 30 Å, is then deposited onto the second interlayer insulating layer and onto sidewalls of the second opening. Portions of the transition metal oxide seed layer, which extend outside the second opening, are then covered by sputter depositing an electrically insulating growth-inhibiting layer onto the metal oxide seed layer at a non-zero tilt angle relative to a normal to the substrate. The second opening is then filled with a phase-changeable material region by growing the phase-changeable material region from portions of the metal oxide seed layer within the second opening. An upper electrode is then formed on the phase-changeable material region.

DETAILED DESCRIPTION OF PREFERRED EMBODIMENTS

Figure 1:
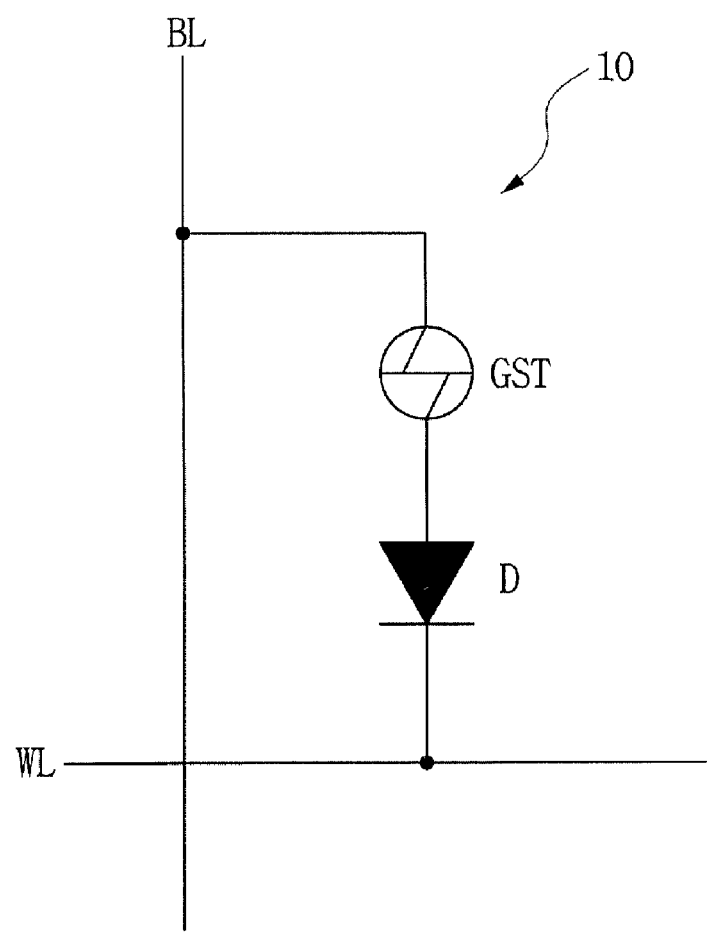
FIG. 1 is an electrical schematic of a conventional diode-type PRAM cell.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

Figure 2A:
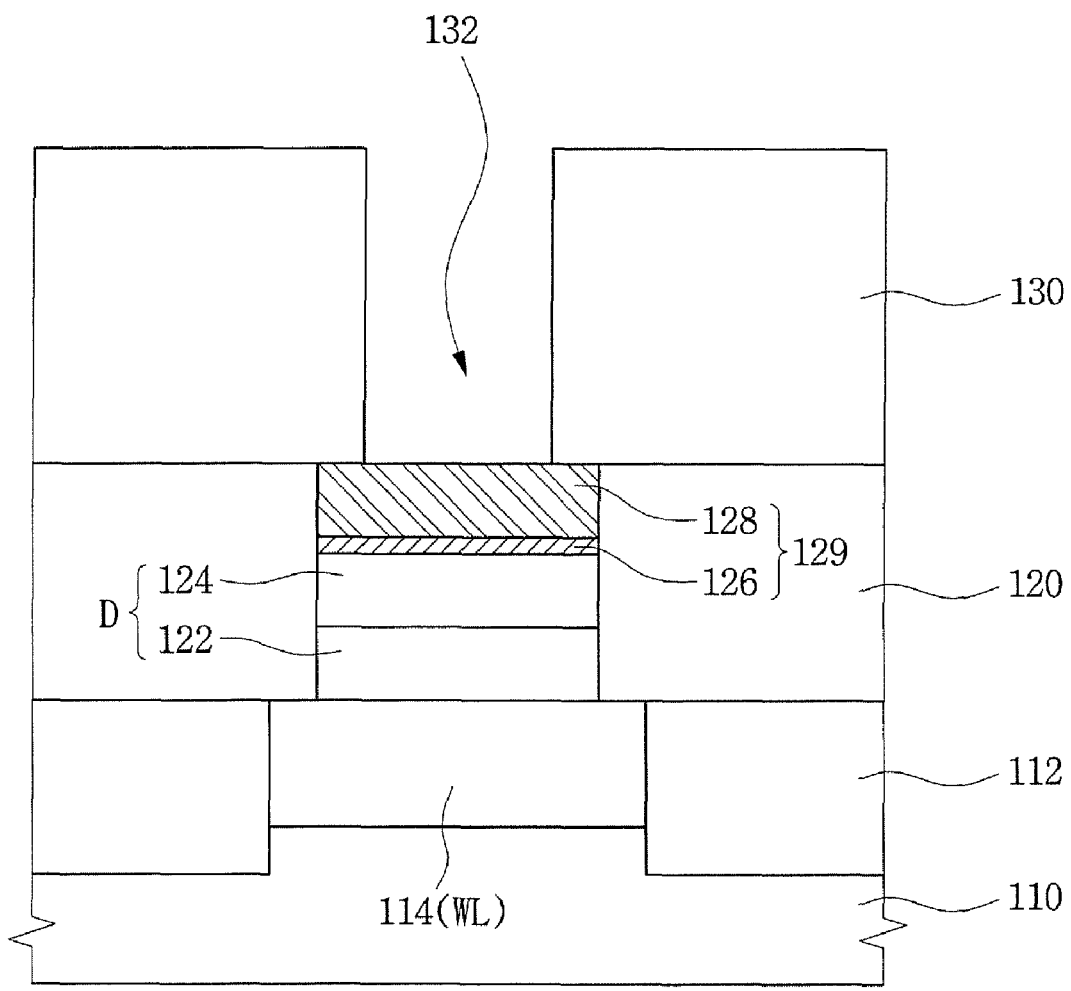
FIGS. 2A-2D are cross-sectional views of intermediate structures that illustrate methods of forming integrated circuit memory devices according to some embodiments of the present invention.

Methods of forming integrated circuit memory devices according to embodiments of the present invention include forming a trench isolation region 112 in a substrate 110, as illustrated by FIG. 2A. This substrate 110 may be a semiconductor substrate containing a well region of first conductivity type therein and the trench isolation region 112 may be formed as a shallow trench isolation (STI) region, a selective polycrystalline silicon oxidation (SEPOX) region or a local oxidation of silicon (LOCOS) region, for example. The trench isolation region 112 may define an active region therebetween and this region may include a word line 114 (WL) of a memory device. This word line 114 may be formed as a semiconductor region of second conductivity type in the substrate 110. Alternative word lines (e.g., polysilicon, metal, etc.) may also be used. This semiconductor word line region may form a P-N rectifying junction with an underlying portion of the substrate 110 that functions as a semiconductor well region of first conductivity type.

A lower interlayer dielectric layer 120 is formed on the substrate 110 and an opening is formed therein that exposes the word line 114. This opening may be formed by selectively etching the lower interlayer dielectric layer 120 using an etching mask (not shown). The lower interlayer dielectric layer 120 may be formed of a dielectric material, such as silicon oxide, silicon nitride and/or silicon oxynitride, for example. In particular, the dielectric material may be formed as an undoped silicate glass (USG) layer, a spin-on glass (SOG) layer, a borophosphosilicate glass (BPSG) layer, a phosphosilicate glass (PSG) layer, a tetraethyl orthosilicate (TEOS) glass layer, a plasma-enhanced TEOS layer or a high density plasma (HDP) oxide layer formed by chemical vapor deposition (CVD), for example.

A diode (D), such as a P-N junction diode, is formed in the opening. This diode is illustrated as including a first semiconductor pattern 122, which electrically contacts an underlying word line 114, and a second semiconductor pattern 124, which forms a P-N rectifying junction with the first semiconductor pattern 122. The first semiconductor pattern 122 may be formed as a semiconductor region having the second conductivity type (e.g., N-type or P-type) and the second semiconductor pattern 124 may be formed as a semiconductor region having the first conductivity type (e.g., P-type or N-type), which is opposite the second conductivity type. In particular, the second semiconductor pattern 124 may be a P-type polycrystalline region and the first semiconductor pattern 122 may be an N-type polycrystalline region. Moreover, the word line 114 may be an N-type semiconductor line that is formed in a surrounding P-type well region. The first and second semiconductor patterns 122 and 124 may be formed as in-situ doped patterns during respective selective epitaxial growth (SEG) steps. In particular, the first and second semiconductor patterns 122 and 124 may be formed in sequence by epitaxially growing in-situ doped polycrystalline silicon in the opening in the lower interlayer dielectric layer 120, using the underlying semiconductor word line 114 (e.g., single crystal silicon word line) as a "seed" for the epitaxial growth.

Referring still to FIG. 2A, a diode electrode 129 is formed on the diode D, as illustrated. This diode electrode 129 is illustrated as including a metal silicide pattern 126 and an electrically conductive pattern 128 on the metal silicide pattern 126. The electrically conductive pattern 128 may include a metal pattern, a metal nitride pattern or a doped polysilicon pattern, for example. In particular, the electrically conductive pattern 128 may including an electrically conductive material selected from a group consisting of: tungsten (W), aluminum (Al), titanium (Ti), copper (Cu), tungsten nitride (WNx), titanium nitride (TiNx), aluminum nitride (AlNx), titanium aluminum nitride (TiAlNx) and/or tantalum nitride (TaNx).

According to alternative embodiments of the present invention, the first and second semiconductor patterns 122 and 124, the metal silicide pattern 126 and the electrically conductive pattern 128 may be formed by sequentially depositing these layers on the substrate 110 to form a composite of layers and then patterning the composite of layers by selectively etching the layers using a mask (not shown). A lower interlayer dielectric layer 120 may then be deposited on the patterned composite of layers. This dielectric layer may then be planarized for a sufficient duration to expose the electrically conductive pattern 128.

Figure 2B:
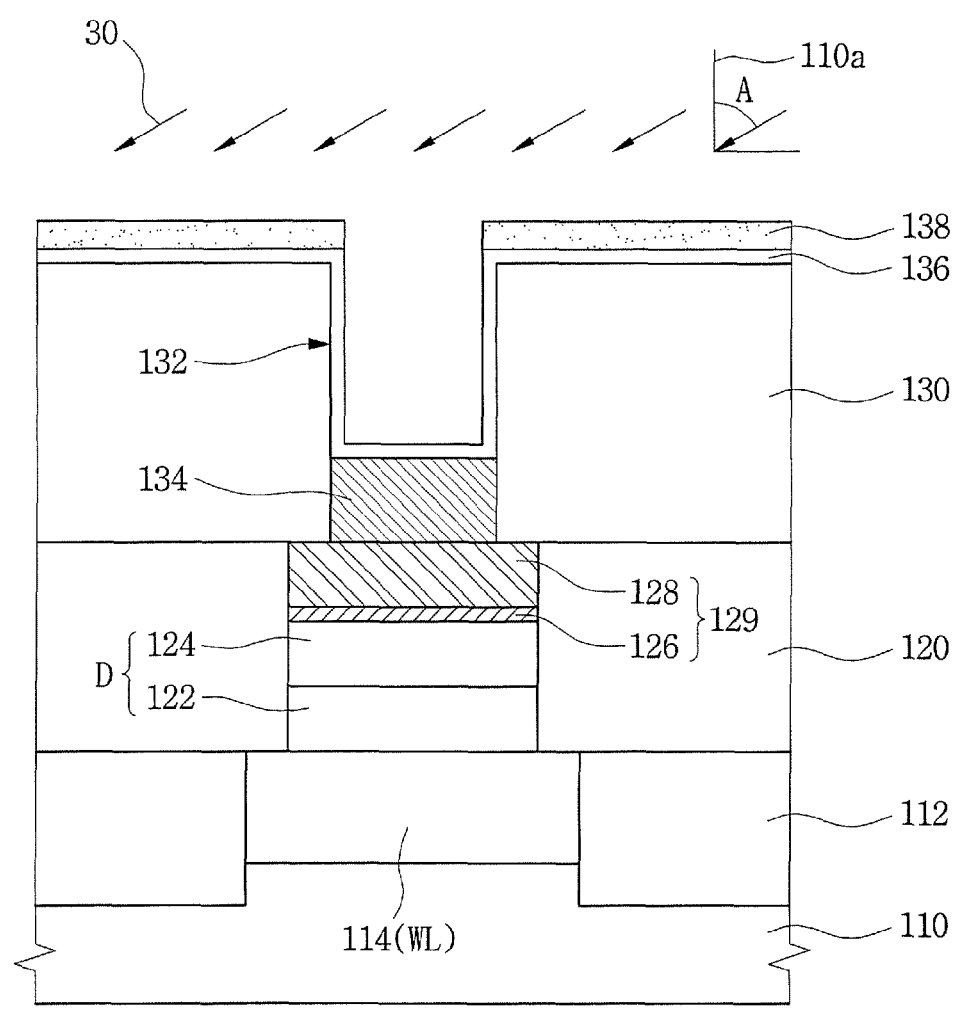

An upper interlayer dielectric layer 130 is formed on the lower interlayer dielectric layer 120 and then patterned (e.g., selectively etched) to define a contact hole 132 therein that exposes an upper surface of the electrically conductive pattern 128. As illustrated by FIG. 2B, a lower electrode 134 of a memory storage device is formed in the contact hole 132. This lower electrode 134 may be formed as a highly conductive layer, such as a metal nitride layer. Thereafter, a "seed" layer 136 is deposited conformally on the upper interlayer dielectric layer 130 and into the contact hole 132, as illustrated. This seed layer, which is electrically connected to the lower electrode 134, may be deposited as a transition metal oxide layer having a thickness in a range between 10 Å and 30 Å, using an atomic layer deposition (ALD) or a chemical vapor deposition (CVD) technique. This transition metal oxide seed layer 136 may include a material selected from a group consisting of titanium oxide, zirconium oxide, hafnium oxide and tantalum oxide.

Referring still to FIG. 2B, the seed layer 136 is then covered by an electrically insulating layer. In particular, portions of the seed layer 136 extending outside the contact hole 132 are selectively covered by sputter depositing 30 an electrically insulating growth-inhibiting layer 138 onto the seed layer 136 at a non-zero tilt angle (A) relative to a normal 110a to the substrate 110. This tilt angle (A) is sufficiently large to inhibit the formation of the growth-inhibiting layer 138 on the inner sidewalls of the seed layer 136 within the contact hole 132. In particular, the tilt angle (A) is in a range between 20° and 65° relative to a normal 110a to the substrate 110 in order to inhibit deposition within the contact hole 132. The growth-inhibiting layer 138 includes a material selected from a group consisting of silicon oxide, silicon nitride, silicon oxynitride, magnesium oxide and aluminum oxide, for example. The sputter depositing of the growth-inhibiting layer 138 may be performed in a conventional sputter deposition chamber that may be powered by a direct current (DC) or radio-frequency (RF) power source, for example. The sputter deposition chamber may include a sputter deposition target (e.g., containing the growth-inhibiting material) having a primary target surface that is rotated relative to a surface of a substrate holder containing a semiconductor wafer being processed. The chamber may also include an ionization source (e.g., Argon gas source injected into chamber) that is directed at the surface of the sputter deposition target.

Figure 2C:
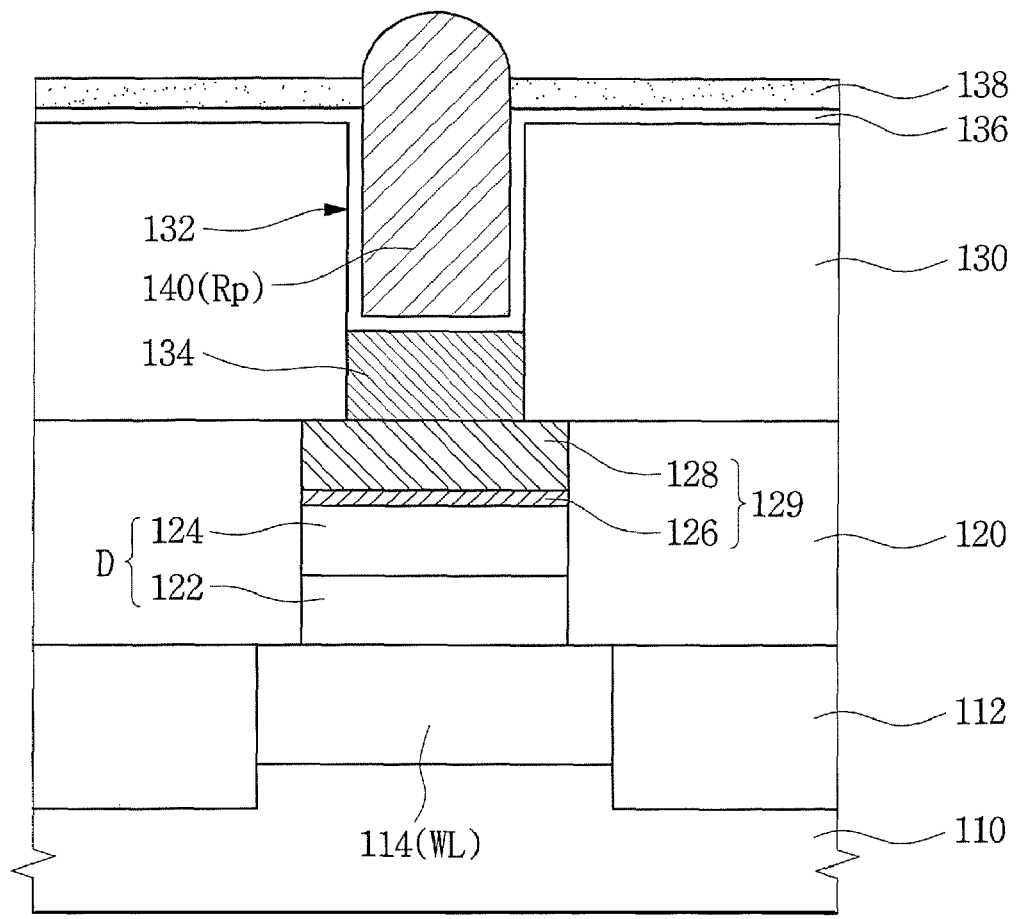
Figure 2D:
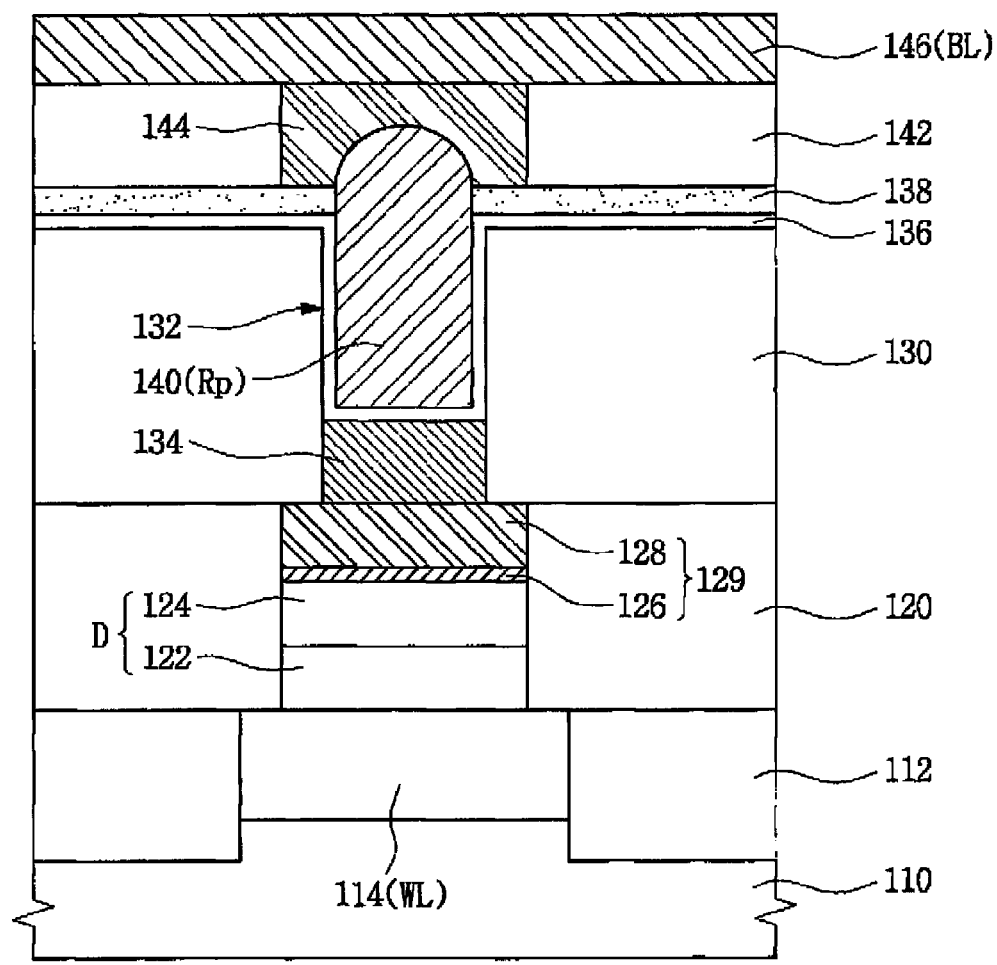

Referring now to FIG. 2C, the contact hole 132 is filled with a phase-changeable material region 140 (having a phase-changeable resistance Rp), by selectively growing the phase-changeable material region 140 from exposed portions of the seed layer 136 within the contact hole 132. This selective growth step may be performed using a chemical vapor deposition (CVD) technique. Other growth techniques may also be used. This phase-changeable material region may be a variable resistivity material, such as a chalcogenide composition (e.g., GST, AST, SST, GBT, . . . ), for example. An upper electrode 144 may be formed on and in electrical contact with the phase-changeable material region 140, as illustrated by FIG. 2D, in order to complete the structure of a phase-changeable memory cell within a multi-celled memory device. In particular, an electrically insulating dielectric layer 142 may be deposited on the phase-changeable material region 140 and then patterned to define an opening therein that is then filled with the upper electrode 144 using conventional processing techniques. This upper electrode 144 may be formed of an electrically conductive material such as polysilicon, metal (e.g., W, Al, Cu, Ta, Ti, Mo, etc.) and/or metal nitride (e.g., WNx, AlNx, TiNx, TaNx, MoNx, NbNx, TiSiNx, TiAlNx, TiBNx, ZrSiNz, WSiNx, WBNx, ZrAlNx, MoSiNx, MoAlNx, MoAlNx, TaSiNx, TaAlNx, etc.). A bit line 146 (BL) may then be formed on the upper electrode 144, as illustrated. As will be understood by those skilled in the art, the series resistance and phase (e.g., crystalline or amorphous) of the phase-changeable material region may be determined during a memory read operation by passing a forward read current through the phase-changeable material region. This read current may be provided by enabling a selected bit line 146 as a current source and enabling a corresponding selected word line 144 as a current sink.

Figure 3A:
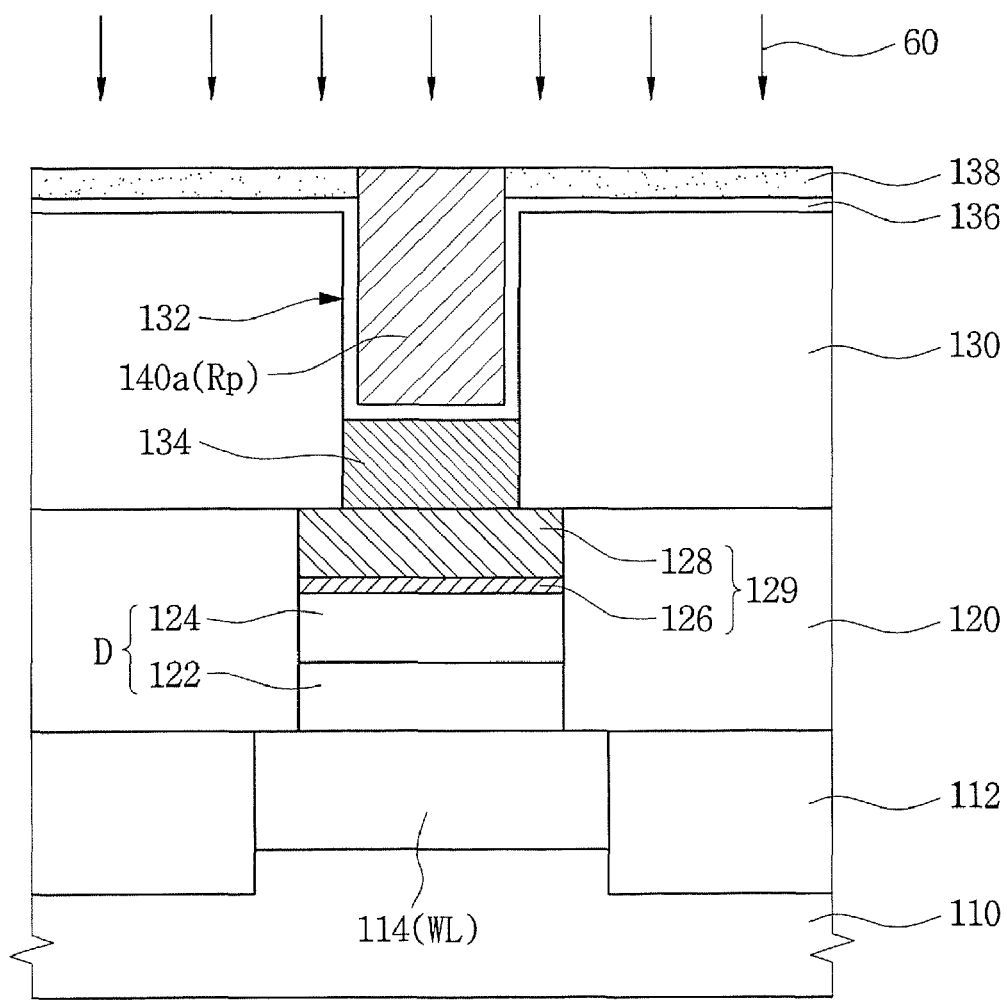
FIGS. 3A-3B are cross-sectional views of intermediate structures that illustrate methods of forming integrated circuit memory devices according to additional embodiments of the present invention.
Figure 3B:
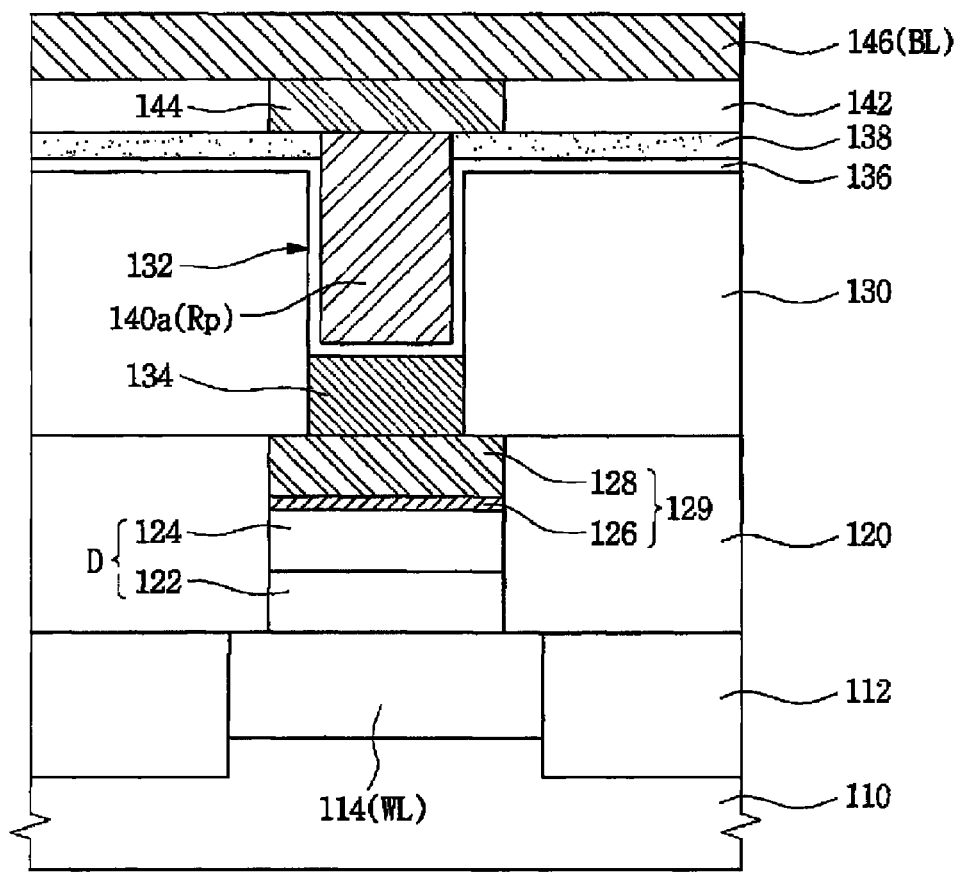

According to alternative embodiments of the present invention, the phase-changeable material region 140 illustrated by FIG. 2C may be modified by planarizing 60 the phase-changeable material region 140 to have an upper surface that is planar with the growth-inhibiting layer 138, as illustrated by FIG. 3A. Alternatively, the planarization step 60 may be performed for a greater duration to expose the seed layer 136 or the upper interlayer dielectric layer 130. Referring now to FIG. 3B, an electrically insulating dielectric layer 142 may be deposited on the planarized phase-changeable material region 140 and then patterned to define an opening therein that is then filled with the upper electrode 144. A bit line 146 may then be formed on the upper electrode 144, as illustrated. Although not shown in FIG. 3B, this bit line 146 may extend in a column direction across a two-dimensional array of phase-changeable memory cells having the structure illustrated by FIG. 2D or 3B.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an integrated circuit memory device, comprising:
    forming an interlayer insulating layer having an opening therein, on a substrate;
    covering a bottom of the opening and lining sidewalls of the opening and an upper surface of the interlayer insulating layer with a seed layer;
    selectively depositing an electrically insulating growth-inhibiting layer on a portion of the seed layer surrounding the opening; and
    forming a phase-changeable material region in the opening.

2. The method of claim 1, wherein the seed layer comprises a transition metal oxide.

3. The method of claim 2, wherein the transition metal oxide is selected from a group consisting of titanium oxide, zirconium oxide, hafnium oxide and tantalum oxide.

4. The method of claim 3, wherein forming a phase-changeable material region comprises selectively growing the phase-changeable material region on the seed layer in the opening.

5. The method of claim 3, wherein forming a phase-changeable material region comprises selectively growing the phase-changeable material region on the seed layer in the opening; and wherein the growth-inhibiting layer comprises a material selected from a group consisting of silicon oxide, silicon nitride, silicon oxynitride, magnesium oxide and aluminum oxide.

6. The method of claim 1, wherein the phase-changeable material region comprises a chalcogenide material.

7. A method of forming an integrated circuit memory device, comprising:
    forming an interlayer insulating layer having an opening therein, on a substrate;
    lining sidewalls of the opening with a seed layer;
    selectively depositing an electrically insulating growth-inhibiting layer on a portion of the interlayer insulating layer surrounding the opening; and
    forming a phase-changeable material region in the opening;
    wherein selectively depositing an electrically insulating growth-inhibiting layer comprises sputter depositing the electrically insulating layer onto the interlayer insulating layer at a tilt angle in a range between 20° and 65° relative to a normal to the substrate.

8. A method of forming an integrated circuit memory device, comprising:
    forming an interlayer insulating layer having an opening therein, on a substrate;
    lining sidewalls of the opening with a seed layer;

selectively depositing an electrically insulating growth-inhibiting layer on a portion of the interlayer insulating layer surrounding the opening; and forming a phase-changeable material region in the opening;

wherein lining sidewalls of the opening with a seed layer comprises lining sidewalls of the opening and an upper surface of the interlayer insulating layer with a seed layer having a thickness in a range between 10 Å and 30 Å; and wherein selectively depositing an electrically insulating growth-inhibiting layer comprises sputter depositing the growth-inhibiting layer onto the seed layer at a tilt angle in a range between 20° and 65° relative to a normal to the substrate.

9. A method of forming an integrated circuit memory device, comprising:

forming an interlayer insulating layer having an array of openings therein, on a substrate;

lining sidewalls of the openings and an upper surface of the interlayer insulating layer with a metal oxide seed layer using a blanket deposition technique;

sputter depositing an electrically insulating growth-inhibiting layer onto the metal oxide seed layer at a tilt angle in a range between 20° and 65° relative to a normal to the substrate, to thereby inhibit deposition of the growth-inhibiting layer into the openings; then filling the openings with respective phase-changeable material regions;

forming upper electrodes on the phase-changeable material regions; and forming a bit line on a plurality of the upper electrodes.

10. The method of claim 9, wherein forming an interlayer insulating layer comprises forming an interlayer insulating layer having an array of openings therein that respectively include a lower electrode at a bottom of the opening; and wherein said lining comprises covering the lower electrodes at the bottoms of the openings with the metal oxide seed layer.

11. The method of claim 10, wherein the metal oxide seed layer comprises a metal oxide selected from a group consisting of titanium oxide, zirconium oxide, hafnium oxide and tantalum oxide.

12. The method of claim 11, wherein the metal oxide seed layer has a thickness in a range between 10 Å and 30 Å.

13. The method of claim 9, wherein the metal oxide seed layer has a thickness in a range between 10 Å and 30 Å.

14. The method of claim 9, wherein filling the openings with respective phase-changeable material regions comprises growing phase-changeable material regions from portions of the metal oxide seed layer that are not covered by the growth-inhibiting layer.

15. The method of claim 9, wherein the growth-inhibiting layer comprises at least one material selected from a group consisting of silicon oxide, silicon nitride, silicon oxynitride, magnesium oxide and aluminum oxide.

16. The method of claim 10, wherein forming an interlayer insulating layer is preceded by forming an electrically insulating layer having an array of diodes therein, between the interlayer insulating layer and the substrate; and wherein the lower electrodes in the interlayer insulating layer are aligned with corresponding ones of the diodes in the array of diodes.

17. A method of forming an integrated circuit memory device, comprising:

forming an electrically conductive word line in a semiconductor substrate;

forming a first interlayer insulating layer having a first opening therein that extends opposite the word line, on the semiconductor substrate;

forming a P-N junction diode having a diode electrode thereon, in the first opening;

forming a second interlayer insulating layer having a second opening therein that exposes the diode electrode, on the first interlayer insulating layer;

depositing a transition metal oxide seed layer having a thickness in a range between 10 Å and 30 Å onto the second interlayer insulating layer and onto sidewalls of the second opening;

covering portions of the transition metal oxide seed layer extending outside the second opening by sputter depositing an electrically insulating growth-inhibiting layer onto the metal oxide seed layer at a non-zero tilt angle relative to a normal to the substrate; then filling the second opening with a phase-changeable material region by growing the phase-changeable material region from portions of the metal oxide seed layer within the second opening; and forming an upper electrode on the phase-changeable material region.

18. The method of claim 17, wherein depositing a transition metal oxide seed layer is preceded by a step of forming a lower electrode at a bottom of the second opening, which is electrically connected to the diode electrode.

19. The method of claim 17, wherein the transition metal oxide seed layer comprises a material selected from a group consisting of titanium oxide, zirconium oxide, hafnium oxide and tantalum oxide.

20. The method of claim 17, wherein the tilt angle is greater than 20°.

* * * * *